(12) United States Patent
Boyd et al.

(10) Patent No.: US 10,886,873 B2
(45) Date of Patent: *Jan. 5, 2021

(54) ENERGY HARVESTING METHODS FOR PROVIDING AUTONOMOUS ELECTRICAL POWER TO BUILDING STRUCTURES AND ELECTRICALLY-POWERED DEVICES IN THE BUILDING STRUCTURES

(71) Applicant: FACE INTERNATIONAL CORPORATION, Norfolk, VA (US)

(72) Inventors: Clark D Boyd, Portsmouth, VA (US); Bradbury R Face, Smithfield, VA (US); Jeffrey D Shepard, Norco, CA (US)

(73) Assignee: Face International Corporation, Norfolk, VA (US)

( * ) Notice: Subject to any disclaimer, the term of this patent is extended or adjusted under 35 U.S.C. 154(b) by 455 days.

This patent is subject to a terminal disclaimer.

(21) Appl. No.: 15/416,354

(22) Filed: Jan. 26, 2017

(65) Prior Publication Data
US 2018/0212552 A1  Jul. 26, 2018

(51) Int. Cl.
*H01L 31/042* (2014.01)
*H02N 6/00* (2006.01)
(Continued)

(52) U.S. Cl.
CPC .............. *H02S 20/22* (2014.12); *H02S 20/26* (2014.12); *H02S 40/20* (2014.12); *H02S 40/34* (2014.12);
(Continued)

(58) Field of Classification Search
CPC ... H01L 31/02327; H02S 20/26; H02S 20/22; H02S 40/20
See application file for complete search history.

(56) References Cited

U.S. PATENT DOCUMENTS 4,967,956 A   11/1990  Mansfield et al.
5,877,874 A   3/1999  Rosenberg
(Continued)

FOREIGN PATENT DOCUMENTS

KR   20110031645 A   3/2011
WO   2014178180 A1   11/2014

OTHER PUBLICATIONS

International Search Report for PCT/UC2016/027393 dated Jul. 29, 2016.
Written Opinion for PCT/US2016/027393 dated Jul. 29, 2016.

*Primary Examiner* — Angelo Trivisonno
(74) *Attorney, Agent, or Firm* — Stephen C. Thomas; Daniel A. Tanner, III (57) ABSTRACT

A method is provided that integrates an autonomous energy harvesting capacity in buildings in an aesthetically neutral manner. A unique set of structural features combine to implement a hidden energy harvesting system on a surface of the building to provide electrical power to the building, and/or to electrically-powered devices in the building. Color-matched, image-matched and/or texture-matched optical layers are formed over energy harvesting components, including photovoltaic energy collecting components. Optical layers are tuned to scatter selectable wavelengths of electromagnetic energy back in an incident direction while allowing remaining wavelengths of electromagnetic energy to pass through the layers to the energy collecting components below. The layers uniquely implement optical light scattering techniques to make the layers appear opaque when observed from a light incident side, while allowing at least 50%, and as much as 80+%, of the energy impinging on the energy or incident side to pass through the layer.

18 Claims, 7 Drawing Sheets

(51) Int. Cl.
  *H02S 20/22* (2014.01)
  *H02S 99/00* (2014.01)
  *H02S 40/34* (2014.01)
  *H02S 40/20* (2014.01)
  *H02S 20/26* (2014.01)

(52) U.S. Cl.
  CPC ............... *H02S 99/00* (2013.01); *Y02B 10/10* (2013.01); *Y02E 10/50* (2013.01)

(56) References Cited

U.S. PATENT DOCUMENTS

| | | |
|---|---|---|
| 8,669,325 B1 | 3/2014 | Hyman |
| 2005/0019712 A1 | 1/2005 | Ikeda et al. |
| 2009/0269579 A1* | 10/2009 | Minaki ................ G02B 5/0825 428/338 |
| 2010/0096006 A1* | 4/2010 | Griffiths ................ G02B 5/288 136/256 |
| 2010/0278561 A1 | 11/2010 | Kanda et al. |
| 2011/0278434 A1 | 11/2011 | Chau et al. |
| 2014/0185282 A1 | 7/2014 | Hsu et al. |

* cited by examiner

FIG. 7

ENERGY HARVESTING METHODS FOR PROVIDING AUTONOMOUS ELECTRICAL POWER TO BUILDING STRUCTURES AND ELECTRICALLY-POWERED DEVICES IN THE BUILDING STRUCTURES

This application is related to U.S. patent application Ser. No. 15/416,303, which published as USPTO pre-grant publication number US2018-0212079A1 on Jul. 26, 2018 entitled "Energy Harvesting Systems For Providing Autonomous Electrical Power To Building Structures And Electrically-Powered Devices In The Building Structures," which was filed in the USPTO on Jan. 26, 2017, the disclosure of which is hereby incorporated by reference herein in its entirety.

BACKGROUND

1. Field of the Disclosed Embodiments

This disclosure is directed to a unique method for forming a set of structural features on building structures, and on structural components within the buildings, the structural features combining to implement an aesthetically neutral, or aesthetically pleasing, energy harvesting system that provides autonomous electrical power to building structures on which the system is installed, and/or to electrically-powered devices in those buildings. Color-matched, image-matched and/or texture-matched optical layers, which provide an essentially same appearance from any viewing angle, and provide superior light transmission across the range of light impingement angles, are formed over energy harvesting components, including photovoltaic components.

2. Related Art

U.S. patent application Ser. No. 15/006,143 (the 143 application), entitled "Systems and Methods for Producing Laminates, Layers and Coatings Including Elements for Scattering and Passing Selective Wavelengths of Electromagnetic Energy," and Ser. No. 15/006,145 (the 145 application), entitled "Systems and Methods for Producing Objects Incorporating Selective Electromagnetic Energy Scattering Layers, Laminates and Coatings," each of which was filed on Jan. 26, 2016 and the disclosures of which are hereby incorporated by reference herein in their entirety, describe a structure for forming selectably energy transmissive layers and certain real world use cases in which those layers may be particularly advantageously employed.

The 143 and 145 applications note that, in recent years, the fields of energy harvesting and ambient energy collection have gained significantly increased interest. Photovoltaic (PV) cell layers and other photocell layers, including thin film PV-type (TFPV) material layers, are advantageously employed on outer surfaces of particular structures to convert ambient light to electricity.

Significant drawbacks to wider proliferation of photocells used in a number of potentially beneficial operating or employment scenarios are that the installations, in many instances, unacceptably adversely affect the aesthetics of the structure, object or host substrate surface on which the PV layers are mounted for use. PV layers typically must be generally visible, and the visual appearance of the PV layers themselves cannot be significantly altered from the comparatively dark greyscale to black presentations provided by the facial surfaces without rendering the layers significantly less efficient, substantially degrading their operation. Presence of photocells and PV layers in most installations is, therefore, easily visually distinguishable, often in an unacceptably distracting, or appearance degrading, manner. Based on these drawbacks and/or limitations, inclusion of photocell arrays, and even sophisticated TFPV material layers, is often avoided in many installations, or in association with many structures, objects or products that may otherwise benefit from the electrical energy harvesting capacity provided by these layers. PV layer installations are often shunned as unacceptable visual detractors or distractors adversely affecting the appearance or ornamental design of the structures, objects or products.

For decades, companies have marketed and installed solar panels in commercial and residential settings. Conventional, solar panels have been provided in a substantially same configuration, mounted as independent structures on the roofs of commercial and residential building structures, in typical installations that seek to achieve an optimum angle for maximum exposure to the sun. The "aiming" of the solar panels only adds to their non-aesthetic appearance as they are rarely mounted in a manner that conforms to the geometry of a roofline, particularly of a residential structure.

In recent years, attempts have been made to render the conventional solar panels less obtrusive by, for example, attempting to disguise them on the roof. These efforts have been of limited success, and generally require installations that significantly degrade the efficiency of the electrical conversion capacity of the solar panels, as installed. Most recently, one residential solar panel company has advertised a unique system by which to incorporate solar energy collectors in individual roof tiles and/or roof shingles. As best understood, this product provides a separate glass layer over individual roof tiles that, when observed from the ground, make the roof tiles appear "properly" colored or textured. When observed from other than optimum angles, however, the solar collectors in these tiles are plainly visible.

Despite attempted advances, solar collectors for residential use generally remain relegated to the "backside" of the roof on a residential home so as to be physically hidden on a generally non-observation side of the residential home structure. Such installations generally disregard whether placement of the solar panels on "that side" of the roof may be optimum for providing energy collection.

In short, building integrated photovoltaic (BIPV) developments have been severely hampered by the lack of aesthetically acceptable and cost-effective implementations.

Further, there are generally no commercial efforts underway at expanding routine conventional installations of solar panels to, for example, the extensive square footage that is available on other faces and façades of most buildings, and particularly residential structures, based on the comparatively unsightly nature of the solar collectors in use today.

SUMMARY

The 143 and 145 applications introduce systems and methods that provide particularly formulated energy or light transmissive overlayers, which may be provided to "hide" typical photoelectric energy generating devices. These overlayers, generally in the form of surface treatments and/or coverings, are formulated to support unique energy transmission and light refraction schemes to effectively "trick" the human eye into seeing a generally opaque surface when observed from a light incident side. These overlayers are formulated to support transmission of visual light, or near-visual light, in a manner that allows a substantial percentage (at least 50% and up to 80+%) of the electromagnetic energy impinging on the surface of the overlayer to penetrate the surface treatments and coverings in a comparatively unfiltered manner. The overlayers also provide an opaque appearing surface that exhibits an essentially same appearance when viewed from any viewing angle, and that support a consistently superior light transmission across a full range of light impingement angles. The energy transmissive layers disclosed in the 143 and 145 applications rely on a particular cooperation between refractive indices of the disclosed micron-sized particles or spheres with cooperating refractive indices of the matrix materials in which those micron-sized particles are suspended for deposition on prepared surfaces. This coincident requirement between the refractive indices of the matrix material and the refractive indices of the suspended particles limits deposition of these material suspensions of particles on substrates to techniques in which the deposition of the materials can be carefully controlled.

U.S. patent application Ser. No. 15/415,851, entitled "Compositions Of Materials For Forming Coatings And Layered Structures Including Elements For Scattering And Passing Selectively Tunable Wavelengths Of Electromagnetic Energy," and Ser. No. 15/415,857, entitled "Methods For Making Compositions Of Materials For Forming Coatings And Layered Structures Including Elements For Scattering And Passing Selectively Tunable Wavelengths Of Electromagnetic Energy," and Ser. No. 15/415,864, entitled "Delivery Systems and Methods For Compositions Of Materials For Forming Coatings And Layered Structures Including Elements For Scattering And Passing Selectively Tunable Wavelengths Of Electromagnetic Energy," each of which was filed Jan. 25, 2017, and the disclosures of which are hereby incorporated by reference herein in their entirety improve upon the inventive concepts disclosed in the 143 and 145 applications by controlling the refractive indices of the particles themselves to capture all of the physical parameters leading to independent color selection in the particles, thereby easing reliance on a cooperative synergy between a composition of the particles and a composition of the binder or matrix material in which the particles are suspended.

It would be advantageous to apply the selectively colorable and/or texturizable overlayers disclosed in detail in the above applications to advanced energy harvesting systems associated with building structures, including residential building structures, to provide significantly enhanced green energy addition to such building structures, and to provide electrical power and control to myriad electrically-driven systems and devices within those building structures.

It would also be advantageous to particularly provide a replacement, and/or a substitute for conventional roofing materials, while maintaining the appearance of those roofing materials, and producing electricity from hidden photovoltaic panels, thereby reducing the total installed cost of the combined roofing and photovoltaic generation system.

Exemplary embodiments may provide substantially transparent particles, including micron-sized particles, in a cooperating binder matrix to produce material compositions for layers in which refractive indices of the constituent elements of the layers are cooperatively controlled to produce repeatable coloration in the layers causing them to appear opaque from a light-incident side, and yet retaining a capacity to transmit at least 50%, and as much as 80+%, of the incident electromagnetic energy therethrough to impinge, for example, on photoelectric or photovoltaic energy harvesters positioned behind the layers.

Exemplary embodiments may form energy transmissive layers over photovoltaic arrays, the energy transmissive layers providing an opaque appearing surface that exhibits an essentially same appearance when viewed from any viewing angle, and supporting a consistently superior light transmission across a full range of light impingement angles.

Exemplary embodiments may provide a TFPV material layer on a substrate that is in a form of a discrete building structural portion. The disclosed TFPV material layers may be adhesively conformed to the discrete building structural portion and then hidden by being overcoated with the disclosed energy transmissive overlayer material. Such building structural portions may include, but not be limited to, conventional roof shingles or tiles, conventional siding, asphalt driveways, concrete walkways, garage doors, entryway doors, door frames and window frames, patios and decking, awnings and virtually any exposed exterior surface, the energy transmissive overlayer material being capable of being formed to display virtually any color, texture, image or the like.

Exemplary embodiments may provide electrical circuits that convert the energy collected by the TFPV layer into electrical power for use by the conventional electrical systems in the building structure, and/or by individual electrical devices installed, or otherwise placed, in the building structure.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed method for forming a unique set of structural features on surfaces of a building structure that combine to implement an aesthetically neutral, or aesthetically pleasing, energy harvesting system that is configured to provide autonomous electrical power to the building structure, and/or to electrically-powered devices in the building structure, will be described, in detail, with reference to the following drawings, in which.

DETAILED DESCRIPTION OF EMBODIMENTS

The disclosed methods for forming a unique set of structural features on a surface of a building structure that combine to implement an aesthetically neutral, or aesthetically pleasing, energy harvesting system configured to provide autonomous electrical power to a building structure, and/or to electrically-powered devices in the building structure, will be described as being particularly usable for implementing green energy objectives, and for providing autonomous electrical energy to power devices in the building structure. These real-world applications for the disclosed energy harvesting systems should not be considered as limiting those systems to charging, recharging, powering, or otherwise providing electrical power to any particular battery, or other electrical system component. Rather, the disclosed embodiments are intended as examples of particular systems that may be implemented to autonomously provide electrical power to any building structure and/or to any electrically-powered devices within, or associated with, the building structure.

Reference will be made to substantially transparent particles, including multi-layer micron-sized particles, and the material compositions in which those particles may be delivered. For building structural component applications, because the fidelity of the surface coloration and texture is less critical than in other applications, particle sizes may be on the order of tens of microns. Reference will also be made to systems and methods for delivery of those material compositions onto building structure component substrate surfaces that have been previously provided with conformal photovoltaic arrays, particularly in a form of a TFPV material layer, according to this disclosure. The disclosed schemes may include techniques for depositing and curing material compositions that suspend substantially transparent multi-layer micron-sized particles in substantially transparent binder or matrix materials, techniques for developing material compositions into structural layers, and delivery systems and techniques for developing the multi-layered structures, which may be laminated structures, in which color-selectable electromagnetic energy transmissive layers are formed over the photovoltaic components. These layers, once formed, may selectively scatter specific wavelengths of electromagnetic energy impinging on an energy incident side of the layers, while allowing remaining wavelengths of the electromagnetic energy to pass therethrough. These layers may uniquely implement optical light scattering techniques in such energy transmissive layers to provide an aesthetically neutral outer surface that is substantially comparable to a conventional surface of a building structure component, including, but not limited to roof shingles/tiles, aluminum/vinyl siding, wood or other material decking, asphalt driveway surfaces, concrete walkway surfaces, and other building structural components such as, for example, doors, door frames, window frames, garage doors, awnings and other like structural members. These layers may also provide an opaque appearing surface that exhibits an essentially same appearance when viewed from any viewing angle, and that supports a consistently superior light transmission across a full range of light impingement angles. Because the disclosed "coatings" do not include pigment materials, the overlayers comprised of these substantially transparent materials are not susceptible to fading over time. In order to provide a usable electrical energy, the disclosed overlayers may be particularly formed to selectively scatter particular wavelengths of electromagnetic energy, including light energy in the visual, near-visual or non-visual range, while allowing remaining wavelengths to pass therethrough with a transmissive efficiency of at least 50%, and as much as 80+%, with respect to the impinging energy.

Additional details regarding the above-discussed energy transmissive layers are available in the various related applications catalogued above, the disclosures of which are incorporated by reference herein in their entireties.

Exemplary embodiments described and depicted in this disclosure should not be interpreted as being specifically limited to any particularly limiting material composition of the individually-described substantially transparent particles, and the binder matrices in which those particles may be suspended, except as indicated according to the material properties generally outlined below. Further, the exemplary embodiments described and depicted in this disclosure should not be interpreted as specifically limiting the configuration of any of the described layers, or of the particular building structures, or building structural components, as substrates on which the disclosed energy harvesting structures may be formed.

References will be made to individual ones, or classes, of energy/light collecting sensor components and energy/light activated devices that may be operationally mounted in, installed in or placed behind the disclosed energy/light scattering, light directing or light transmissive layers so as to be hidden from view when an object including such sensor components or devices is viewed from a viewing, observation or light incident outer surface of the object or layer, from which perspective the energy/light scattering, light directing or light transmissive layers may appear "opaque" to the incident electromagnetic energy. These references are intended to be illustrative only and are not intended to limit the disclosed concepts, compositions, processes, techniques, methods, systems and devices in any manner. It should be recognized that any advantageous use of the disclosed structures and schemes for providing an autonomous energy harvesting capability in a building structure employing systems, methods, techniques, and processes such as those discussed in detail in this disclosure is contemplated as being included within the scope of the disclosed exemplary embodiments.

In this regard, the disclosed systems and methods will be described as being particularly adaptable to hiding certain photovoltaic materials, and the emerging class of increasingly efficient TFPV materials or material layers, which are typically mils thick, on the surfaces of, or within objects, behind layers that may appear opaque from a viewing, observation or light incident side. As used throughout the balance of this disclosure, references to TFPV material layers are not intended to exclude other types of photovoltaic materials, and/or any generally known configuration as to any photocells, which may be adapted for use in particular building structural components.

Figure 1:
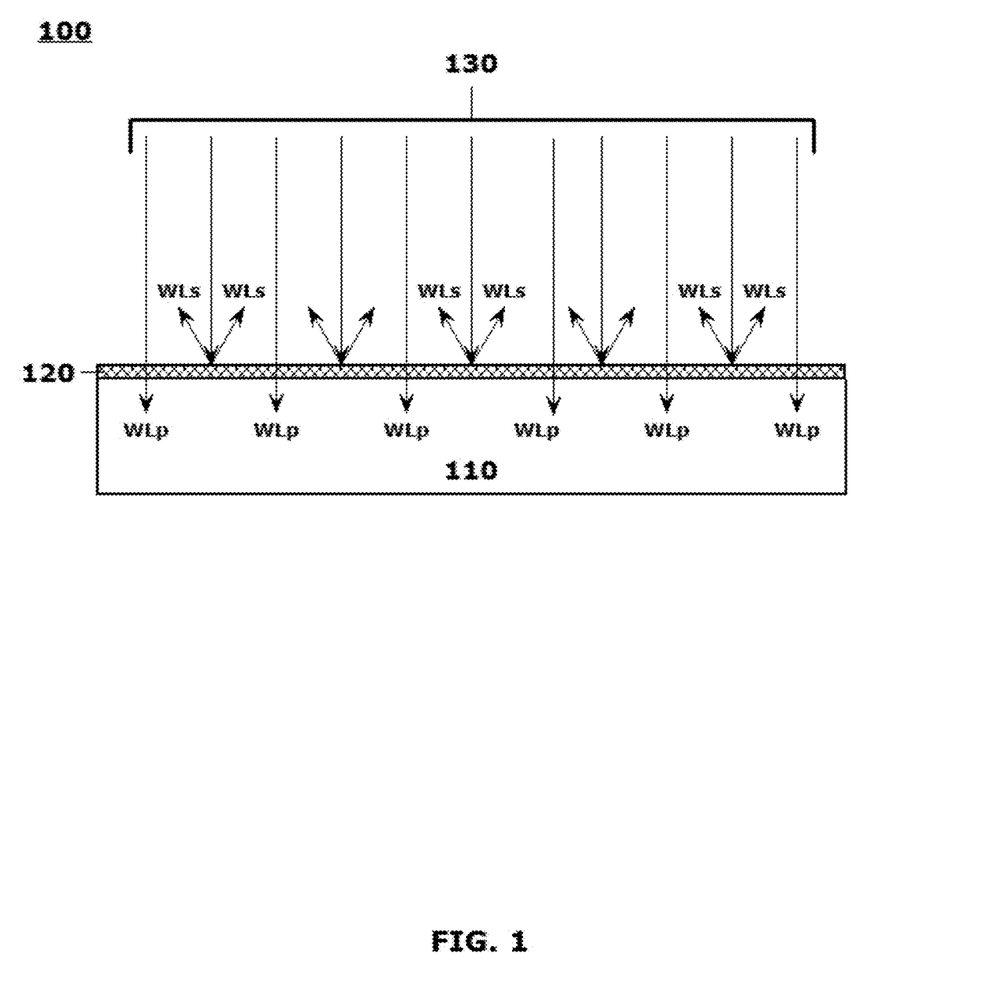
FIG. 1 illustrates a schematic diagram of an exemplary object energy/light scattering surface layer disposed on a structural body member substrate according to this disclosure.

FIG. 1 illustrates a schematic diagram 100 of an exemplary object energy/light scattering surface layer 120 disposed on a transparent portion of a body structure 110. As shown in FIG. 1, the energy/light scattering layer 120 is configured to allow first determined wavelengths of energy/light, WLp, to pass through the energy/light scattering layer 120. The configuration of the energy/light scattering layer 120 simultaneously causes certain second determined wavelengths of energy/light, WLs, to be scattered back in an incident direction substantially as shown.

The energy/light scattering layer 120 may be configured of substantially transparent particles of varying sizes. In embodiment, these particles may be substantially in a range of 5 microns or less. The substantially transparent micron-sized particles may be stabilized in structural or other layers further comprised of substantially-transparent matrix materials including, but not limited to, dielectric materials. An ability to configure the substantially transparent particles to "tune" the light scattering surface of the light scattering layer 120 to scatter particular second determined wavelengths of energy/light, WLs, may provide the capacity of the energy/light scattering layer 120 to produce a desired visual appearance in a single color, multiple colors, or according to an image-wise visual presentation provided by the energy/light scattering layer 120. Put another way, depending on a particular composition of the substantially transparent particles comprising the energy/light scattering layer 120 (or multiple layers), one or more colors, textures, color patterns, or color-patterned images may be visually produced by the energy/light scattering layer 120.

In cases where the incident energy includes wavelengths in the visual spectrum, refractive indices of the energy/light scattering layer 120 may be selectively tuned based on structural compositions of the substantially transparent particles, and the substantially-transparent binder or matrix materials in which the particles are suspended. In embodiments for use in building structures according to this disclosure, the energy/light scattering layer 120 is intended to appear as a single color across a surface of the energy/light scattering layer 120. To this end, the composition of the particles and matrix scheme across the surface of the energy/light scattering layer 120 may be substantially identical, or homogenous.

A light scattering effect of the energy/light scattering layer 120 may be produced in response to illumination generally from ambient light in a vicinity of, and/or impinging on, the surface of the energy/light scattering layer 120. Alternatively, the light scattering effect of the energy/light scattering layer 120 may be produced in response to direct illumination generally produced by some directed light source 130 focusing illumination on the light-incident surface of the energy/light scattering layer 110.

Figure 2:
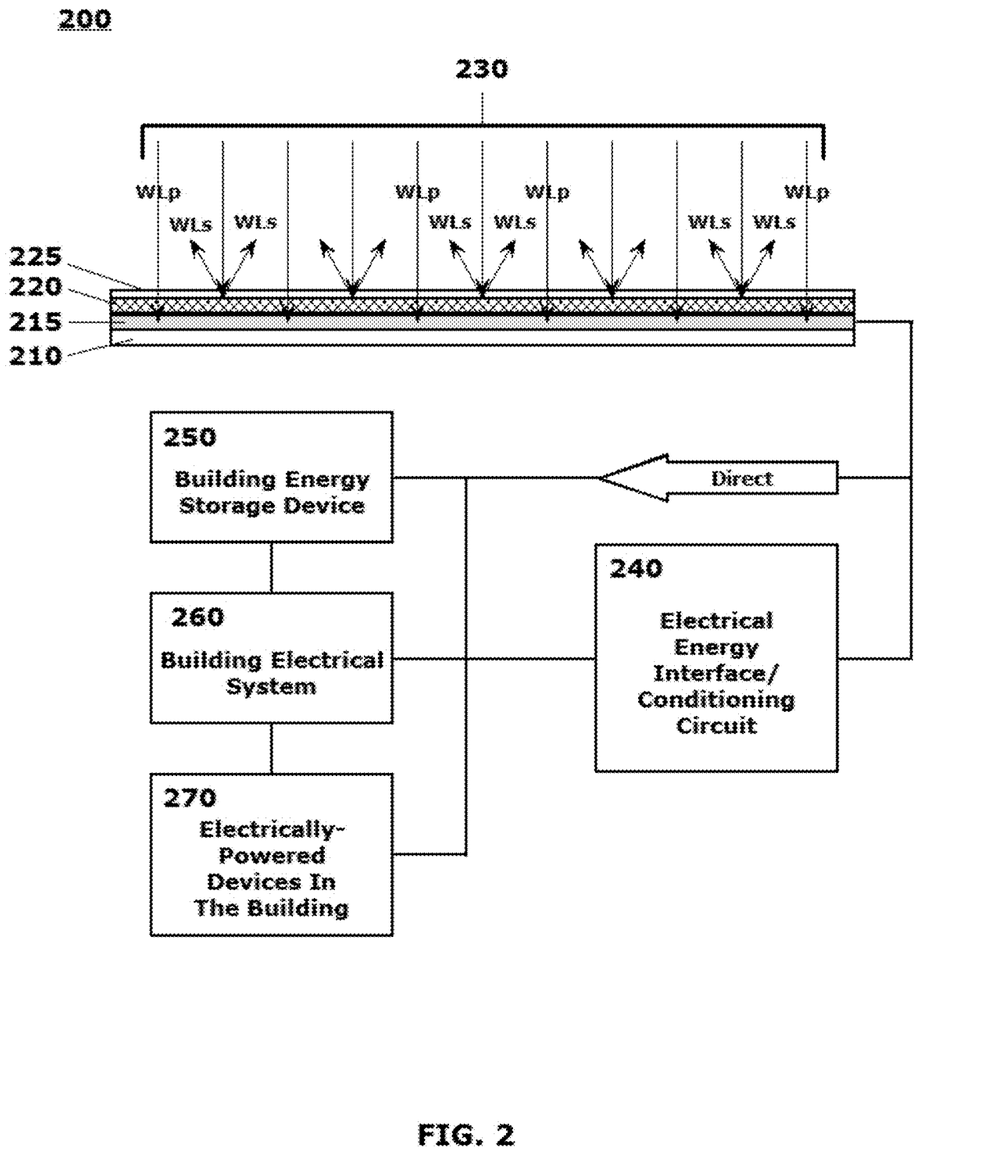
FIG. 2 illustrates a schematic diagram of an exemplary building structure energy harvesting system including a laminated energy harvesting component with, as one or more of the laminate layers, a TFPV material layer disposed on a building structure component substrate, and an energy/light scattering layer according to this disclosure disposed over the TFPV material layer.

FIG. 2 illustrates a schematic diagram 200 of an exemplary building structure energy harvesting system including a laminated energy harvesting component with, as one or more of the laminate layers, a TFPV material layer disposed on a building structure component substrate, and an energy/light scattering layer according to this disclosure disposed over the TFPV material layer. As shown in FIG. 2, the ambient energy/light in a vicinity of the energy/light scattering layer 220, or the energy/light directed from an energy/light source 230 at the energy/light scattering layer 220, may pass through a substantially clear overlayer 225, which may be in the form of a substantially clear protective layer. The energy/light scattering layer 220 may be configured to operate in a same manner as the energy/light scattering layer described above with reference to FIG. 1. At least first wavelengths of energy/light, WLp, may pass through the energy/light scattering layer 220, while at least the second wavelengths of energy/light, WLs, may be scattered back in the incident direction in the manner described above.

The at least first wavelengths of energy/light, WLp, may impinge on a TFPV material layer 215 that may be disposed on, or adhered to, a surface of a building structural component substrate 210. The at least first wavelengths of energy/light, WLp, impinging on the TFPV material layer 215 may cause the TFPV material layer 215 to generate electrical energy which may be passed to an electrical energy interface/conditioning circuit 240 to which the TFPV material layer 215 is electrically connected. The electrical energy interface/conditioning circuit 240 may properly translate or otherwise condition the generated electrical energy from the TFPV material layer 215 to be one or more of (1) stored in a compatible building energy storage device 250, (2) used to directly supplement the building electrical system 260 or (3) provided to directly power one or more electrically-powered devices 270 in the building. In embodiments, the electrical energy generated from the TFPV material layer 215 may bypass the electrical energy interface/conditioning circuit 240 and be fed directly to any of the depicted devices or systems according to the "Direct" line in FIG. 2. Excess generated electrical power may be returned to the local grid according to applicable circuitry (not shown).

FIGS. 3A-3D illustrate a series of schematic diagrams of steps in an exemplary process 300 for forming a laminated energy harvesting component, with at least one layer constituted as a light scattering constituent layer, according to this disclosure.

Figure 3A:
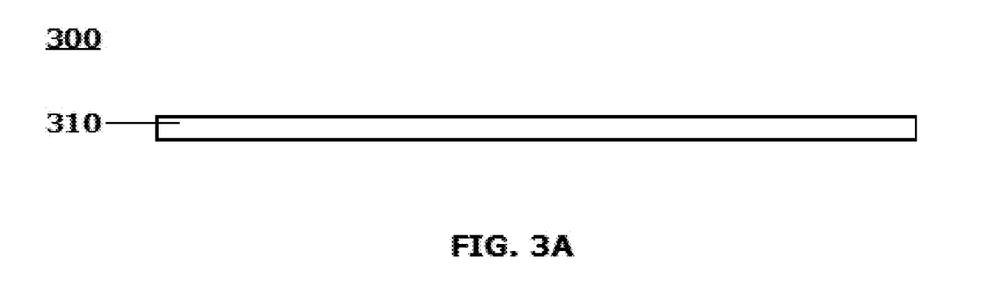
FIGS. 3A-3D illustrate a series of schematic diagrams of steps in an exemplary process for forming a laminated energy harvesting component, with at least one layer constituted as an energy/light scattering layer, according to this disclosure.

As shown in FIG. 3A, a substrate component 310 may be provided. The substrate component 310 may be, for example, a building structural component. Such a building structural component may be one or more of a roofing component (tile, shingle, and the like), a siding structure, a door, a door/window frame, a patio/deck, an awning or other comparable discrete building structural part, or portion.

Figure 3B:
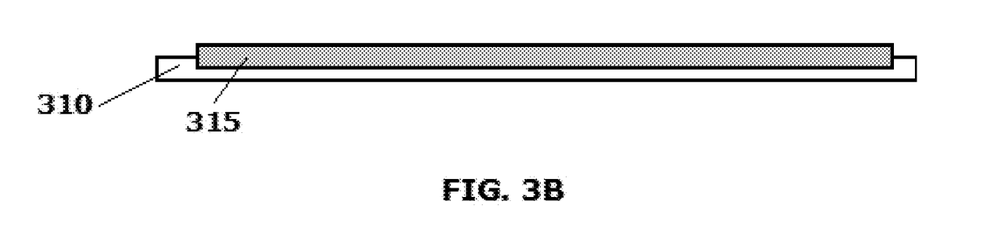

As shown in FIG. 3B, a photovoltaic layer (or component) 315 may be disposed on the substrate component 310. The photovoltaic layer 315 may comprise one or more of a photocell, an array of photocells, or a TFPV material layer. Further, the photovoltaic layer 315 may be positioned on a contiguous surface of the substrate component 310, or may be partially embedded in a cavity in the surface of the substrate component 310, or may be completely embedded in a cavity in the surface of the substrate component 310 in a manner that an upper surface of the photovoltaic layer 315 substantially corresponds to an upper surface of the substrate component 310. In embodiments, a TFPV material layer may be adhesively attached to, or formed on, the substrate component 310. In embodiments, a surface treatment may be applied to portions of the surface of the substrate component 310 that are not covered by the photovoltaic layer 315. The surface treatment, when applied, is intended to render an optical reflectance of the portions on which the surface treatment is applied to be substantially equal to an optical reflectance of the TFPV material layer in order to provide a consistent undersurface for application of an energy/light scattering layer.

Figure 3C:
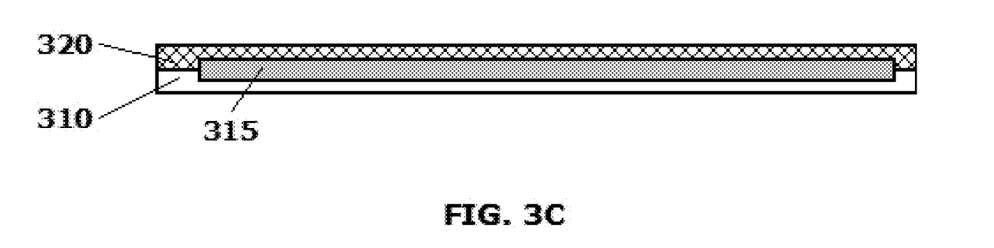

As shown in FIG. 3C, an energy/light scattering layer 320 may be formed on/over the photovoltaic layer 315 in a manner that first determined wavelengths of the ambient light in the vicinity of the energy/light scattering layer 320 may pass through the energy/light scattering layer 320, in the manner described above with reference to the embodiments shown in FIGS. 1 and 2, while at least second determined wavelengths of the ambient light may be scattered back off the energy/light scattering layer 320 in the incident direction in the manner described above.

Figure 3D:
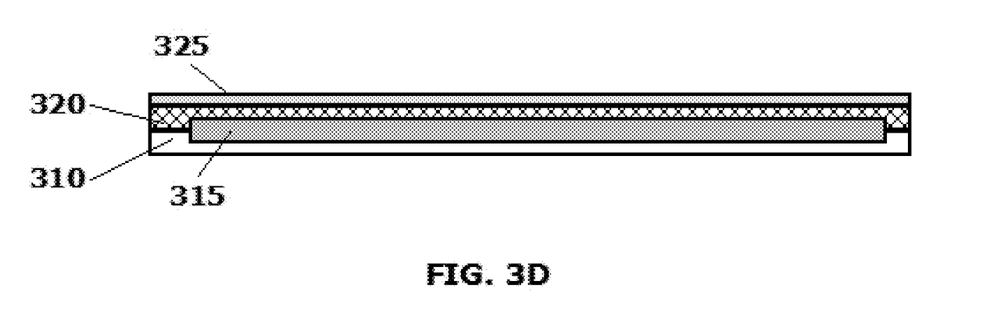

As shown in FIG. 3D, the laminated structure of the energy harvesting component may be finished by covering, or even encapsulating, the laminated structure in a substantially clear, protective overcoat or outer layer 325. This 
protective overcoat or outer layer 325 may be in a form, for example, of a clear coat finish.

Figure 4:
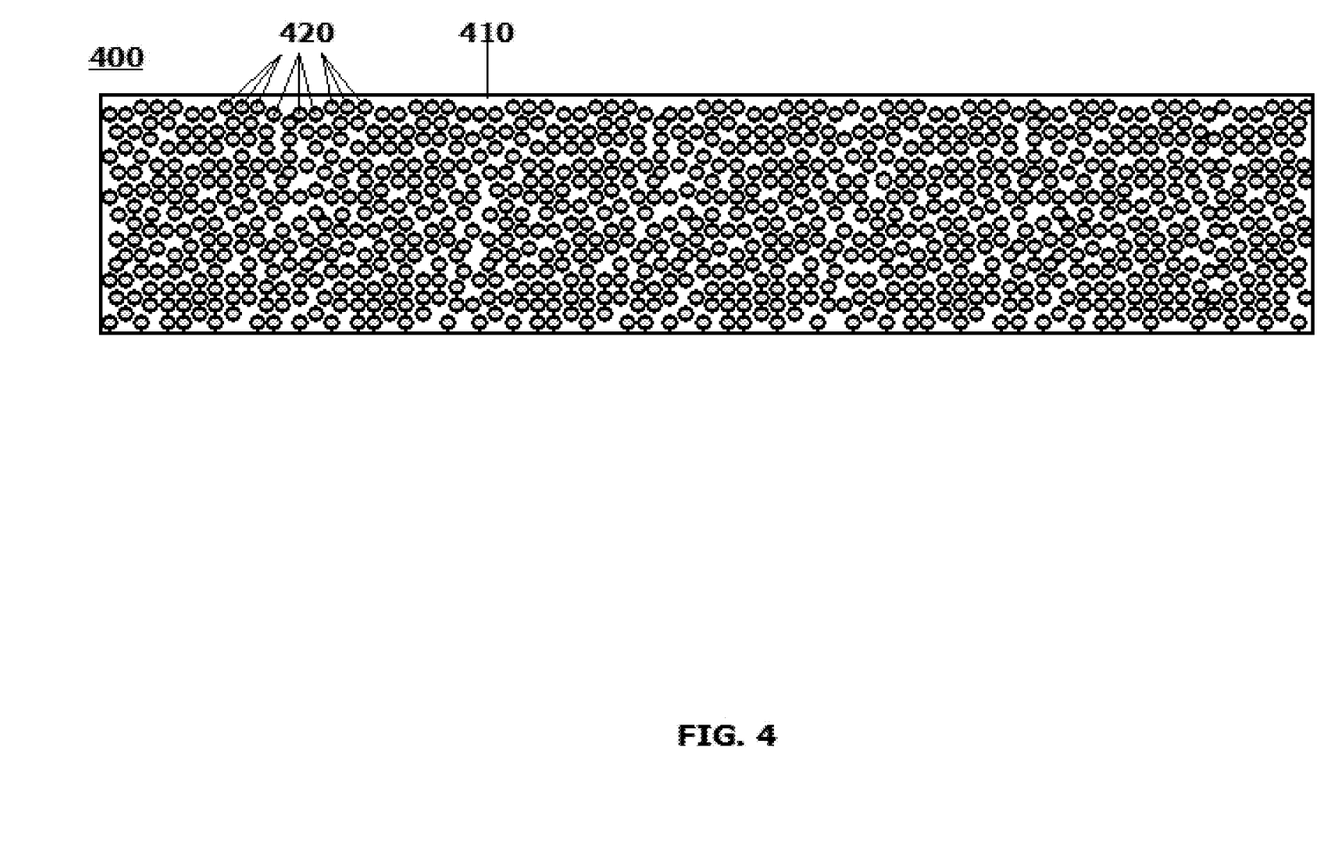
FIG. 4 illustrates an exemplary embodiment of a detail of an energy/light scattering layer usable in the energy harvesting systems according to this disclosure.

FIG. 4 illustrates an exemplary embodiment of a detail of an energy/light scattering layer 400 according to this disclosure. The disclosed schemes, processes, techniques or methods may produce an energy/light scattering layer 400 created using substantially transparent multi-layer micron-sized particles 420. In embodiments, the particles may be in range of diameters of 5 microns or less embedded in a substantially-transparent dielectric matrix 410. In other embodiments, the particles may be significantly larger. As an example, the substantially transparent multi-layer micron-sized particles 420 may include titanium dioxide nanoparticles in a layered form. Titanium dioxide is widely used based on its brightness and comparatively high refractive index, strong ultraviolet (UV) light absorbing capabilities, and general resistance to discoloration under exposure to UV light.

In embodiments of the energy/light scattering layers, colorations of the layered materials may be achieved through combinations of (1) material compositions of the particles, (2) material compositions of the binders, (3) nominal particle sizes, (4) nominal particle spacings, and (5) interplay between any or all of those material factors. That "interplay" is important. In other embodiments, the material interplay may be captured in varying layers of a substantially transparent multi-layer micron-sized particle, thus requiring the only variables to be controlled as particle size and particle physical composition. Capturing all of the physical parameters in the substantially transparent multi-layer micron-sized particle substantially eliminates any requirement for constituent interplay between the particles and the binder, essentially rendering the particles binder or matrix material agnostic. In embodiments including the multi-layer particles, the binder or matrix material is provided simply to hold the particles where they land. Spacing between the particles is rendered based on a substantially clear, neutral outer coating on the substantially transparent multi-layer micron-sized particles, typically of a substantially transparent dielectric material having a comparatively low (less than 2) index of refraction. The employment of multi-layer particles provides increased latitude in the use of randomized delivery methods, including spray delivery of an aspirated composition of non-pigment particulate material suspended in a comparatively transparent or relatively clear binder material.

In embodiments with particles comprised of layered constructions, a core sphere may have a diameter to accommodate an optical path length through the core of approximately one half wavelength of light for the color of interest and may be comprised of 15 or more individual material layers each having a thickness to accommodate an optical path length through the layer of one quarter wavelength of light for the color of interest. For individualized colors from blue to red this layer-on-layer construction surrounding the core sphere may result in an overall particle size of from about 1.9 microns up to 2.6 microns. This range of overall particle sizes for the multi-layered construction of the transparent spheres is comparable to the typical ranges of diameters of paint pigment particles. Apparent colors, patterns or images of light scattering layers may be produced by adjusting refractive indices of the particles according to a size of the spherical core and the layers of material deposited on the spherical core of the particles. Such particle compositions allow for additional degrees of freedom in adjusting the color, transmission and scattering, i.e., in "tuning" the energy/light scattering effects produced by the composition of the energy/light scattering layer. As mentioned above, an outer layer may be formed of a neutral, transparent, often dielectric material of a thickness selected to provide a minimum required separation between the "colorant" layers of the substantially transparent multi-layer micron-sized particles to reduce instances of refractive interference, thereby causing variation in the color presentation provided by the light scattering layer.

Dielectric materials from which the core sphere and the dielectric materials may be selected may be chosen generally from a group consisting of titanium dioxide, silicon carbide, boron nitride, boron arsenite, aluminum nitride, aluminum phosphide, gallium nitride, gallium phosphide, cadmium sulfide, zinc oxide, zinc selenide, zinc sulfide, zinc telluride, cuprous chloride, tin dioxide, barium titanate, strontium titanate, lithium niobate, nickel oxide, and other similar materials.

Particle size is related to the wavelength of interest, in the manner described above, in order to determine the color of the substantially transparent multi-layer micron-sized particles. Spacing between the particles is related to the size in order to reduce interference between the refractions of separate particles. In embodiments, the binder index of refraction may be the same as an outer layer of the particles in order that the outer layer does not optically interact with the next layer inward. In such an instance, the outer layer may be thicker, and particle-to-particle optical interaction is minimized. Where there is a difference in index of refraction (according to Snell's Law), a reflection occurs. When two reflections are spaced properly, the interaction of multiple reflections is what provides the color.

The outer layer may be configured to ensure that the colorant producing layers of the particles are kept separated. In an instance in which the colorant producing layers touch, no interaction reflection is generated. A result of a configuration of a particle according to this scheme is a particle that acts in a form of a Bragg Reflector. Multiple weak reflections of a same wavelength reinforce each other resulting in a strong reflection of a particular wavelength based on the particle size, which determines the particle spacing, and the index of refraction also determines the speed of light which in turn describes the optical wavelength. A number of particles per unit volume of solvent (matrix material) is essentially going to ensure that the particles always touch.

The outer layer will typically be thicker than the underlayers of which the substantially transparent multi-layer micron-sized particle is comprised in order to attempt to ensure that safe separation is maintained. If the outer layer is controlled to be composed of a material that is at a same index of refraction as the binder or matrix material, the outer layer does not optically react in interaction with the binder or matrix material. The outer layer will be transparent, and maintain that transparency when immersed in the substantially-transparent binder or matrix material having a same index of refraction as the outer layer of substantially transparent multi-layer micron-sized particles. In this manner, the outermost layers, in their composition and thickness, provide the essential interstitial spacing between the colorant components so as to assure color fidelity. The layers thus formed will yield only the color that is "built in" to the substantially transparent multi-layer micron-sized particles according to the structure of the color yielding/generating underlayers inward of the outermost layers in the manner described below.

With enough layers, in a range of 10 to 15, to as many as 30, layers, color concentration would be high enough in each of the particles so as to not require external coloration reinforcement provided by adjacent multi-layer particles. The outer layers are comparatively clear, as is the binder or matrix solution, and preferably having a comparatively same index of refraction as between the material forming the outer layers and the material forming the binder solution. This is to ensure that there is no interaction between the particles and the binder, and no interaction between the particles, specifically the color yielding/generating components of the particles over a longer distance. The outer layers may be comparatively, e.g., 10 times the thickness of each of the underlying dielectric layers.

The substantially transparent multi-layer micron-sized particles may be formed in a very tightly-controlled particle build process. A spherical core may be formed in a material or layer deposition process such as, for example, an atomic layer deposition (ALD) process, to achieve the substantially transparent multi-layer micron-sized particles according to the disclosed schemes. Particle deposition control systems exist that can be scaled to produce these substantially transparent multi-layer micron-sized particles. Quality control in the particle build process produces the necessary level of color consistency. There are, however, deposition processes that can be controlled to the units of nanometers thicknesses.

Additionally, embodiments of the multi-layered particles may include metallic layers sandwiched in between pairs of dielectric layers. A thickness of the metallic layers may be between 0.01 nm and 10 nm, as long as the metallic layers remain substantially transparent. The presence of such metallic layers is intended to enhance reflectivity properties with respect to the multi-layered structure of the color yielding/generating layers of the substantially transparent multi-layer micron-sized particles. Indium titanium oxide (ITO) is an example of a metallic layer that is conductive, yet substantially transparent. A typical touch screen on a cellular telephone, for example, includes an ITO surface.

Any suitable acrylic, polyurethane, clearcoat, or like composed binder or matrix material having a low index of refraction may be adapted to suspend the multi-layer micron-sized particles for application to a broad spectrum of substrate materials. These may include, but not be limited to, for example, synthetic or natural resins such as alkyds, acrylics, vinyl-acrylics, vinyl acetate/ethylene (VAE), polyurethanes, polyesters, melamine resins, epoxy, silanes or siloxanes or oils. It is envisioned that, in the same manner that paint pigment particles are suspended in solution, the substantially transparent multi-layer micron-sized particles according to this disclosure may be suspended in solution as well. Unlike paint pigment particles, however, the optical response of particles according to the disclosed schemes will not "fade" over time because there is no pigment breakdown based on exposure to, for example, ultraviolet (UV) radiation. The disclosed particles may also be substantially insensitive to heat.

According to the above, application methodologies that are supportable with particles according to the disclosed schemes include all of those application methodologies that are available for application of paints, inks and other coloration substances to substrates. These include that the particles suspended solutions can be brushed on, rolled on, sprayed on and the like. Separately, the particles may be pre-suspended in the solutions, or provided separately for on-site apparatus mixing into the deliverable solutions at the point of delivery to a substrate surface. The particles may be delivered via conventional aspirated spray systems and/or via aerosol propellants including being premixed with the propellants for conventional "spray can" delivery. Finally, the particles may be dry delivered to a binder-coated substrate. Conventional curing methods may be employed to fix the binder-suspended particles on the various substrates.

In the above-described manner, a finished and stabilized apparent colored, multi-component colored, texturized or otherwise image-developed surface transparent light scattering layer is produced. Mass production of such layers could be according to known delivery, deposition and development methods for depositing the light scattering layer forming components on the base structures as layer receiving substrates, and automatically controlling the exposure, activation and/or stabilization of the surface components to achieve a particular colored, multi-colored, texturized and/or image-wise patterned light scattering layer surface.

Additives may be included in the binder or matrix materials in which the substantially transparent multi-layer micron-sized particles are, or are to be, suspended to enhance one or more of a capacity for adherence of the formed transmissive layer to a particular substrate, including an adhesive or the like, and a capacity for enhanced curing of the layer, including a photo initiator or the like.

Figure 5:
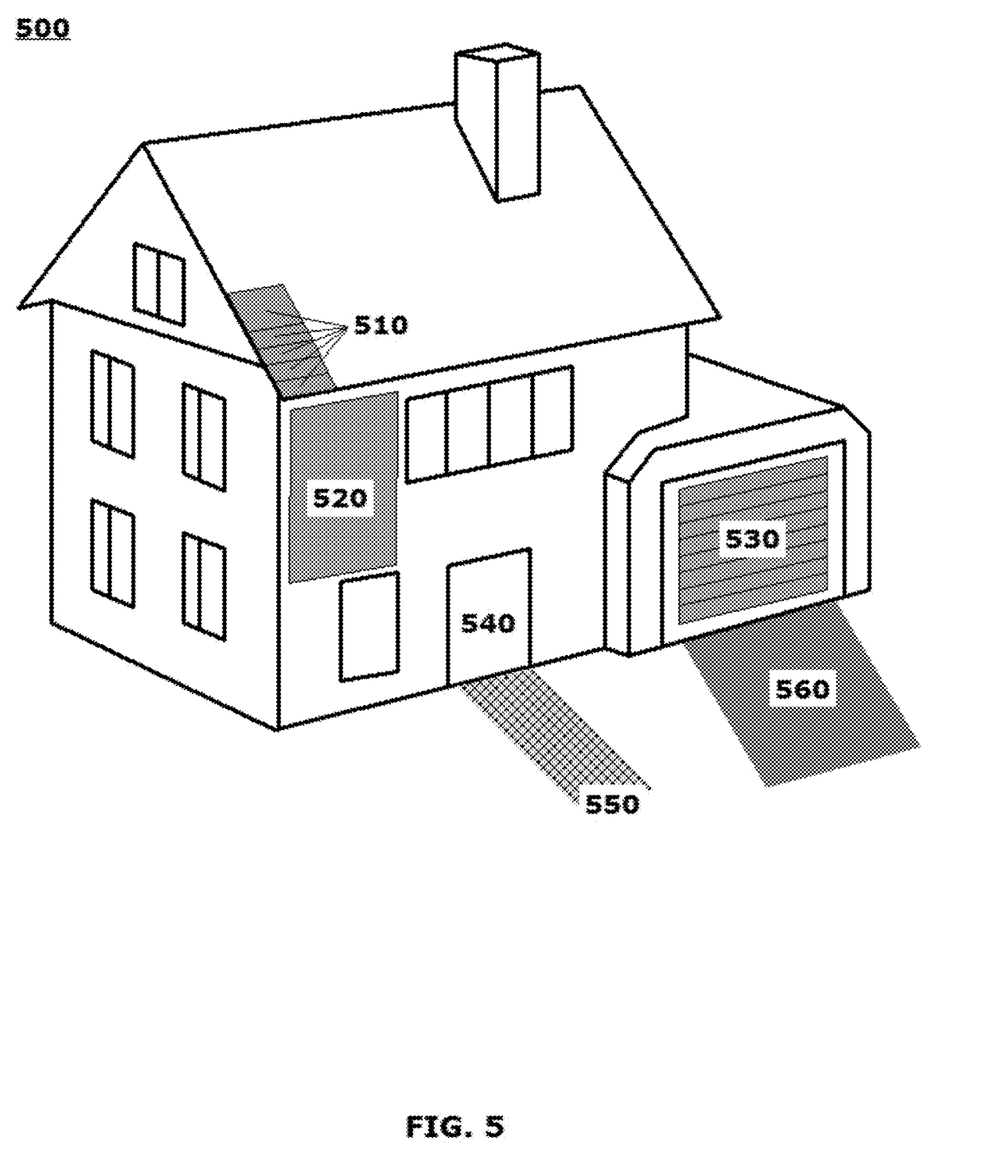
FIG. 5 illustrates a schematic diagram of an exemplary residential building to provide examples of emplacement of laminated energy harvesting components according to this disclosure on an outer surface of the building structure.

FIG. 5 illustrates a schematic diagram of an exemplary residential building structure 500 to provide examples of emplacement of laminated energy harvesting components according to this disclosure on an outer surface of the building structure. Although depicted in FIG. 5 as a residential building structure, it should be noted that any building structure may serve as a host to the disclosed laminated energy harvesting component. As shown in FIG. 5, any substrate surface of a structural body component of the residential building structure 500 may be used to host the laminated energy harvesting component. This may include a roof tile or shingle of the structure hosting the energy harvesting component 510; a portion of a siding of the structure hosting an energy harvesting component 520; a garage door hosting an energy harvesting component 530; an entry door hosting an energy harvesting component 540; a section of a sidewalk, patio, deck or the like hosting an energy harvesting component 550; a section of a driveway hosting an energy harvesting component 560; or other like portion of the residential building structure 500 hosting an energy harvesting component. As will be understood by those of skill in the art to be more preferable for better exposure to solar energy in sunlight, horizontal or canted surfaces associated with the roof of the residential building structure 500 may be covered, partially or substantially completely, with a laminated energy harvesting component. Separately, a solid, rollable, foldable or other cover in the form of, for example, an awning may be provided extending from any vertical surface of the residential building structure 500. Regardless of the placement, wired or wireless connection may be provided to, for example, an energy conversion component in the residential building structure 500 in order to collect the electrical energy generated by the photovoltaic layers in the laminated structures and to communicate compatible and/or conditioned electrical energy to the building structure system components, as described generally above in reference to FIG. 2. Adjacent or abutting structural elements such as, for example, overlapping roof shingles/tiles, sections of siding, and the like, may include cooperating electrical traces on edges or sides in order that electrical connections can be made between individual photovoltaic elements on each of the adjacent or abutting structural elements.

Figure 6:
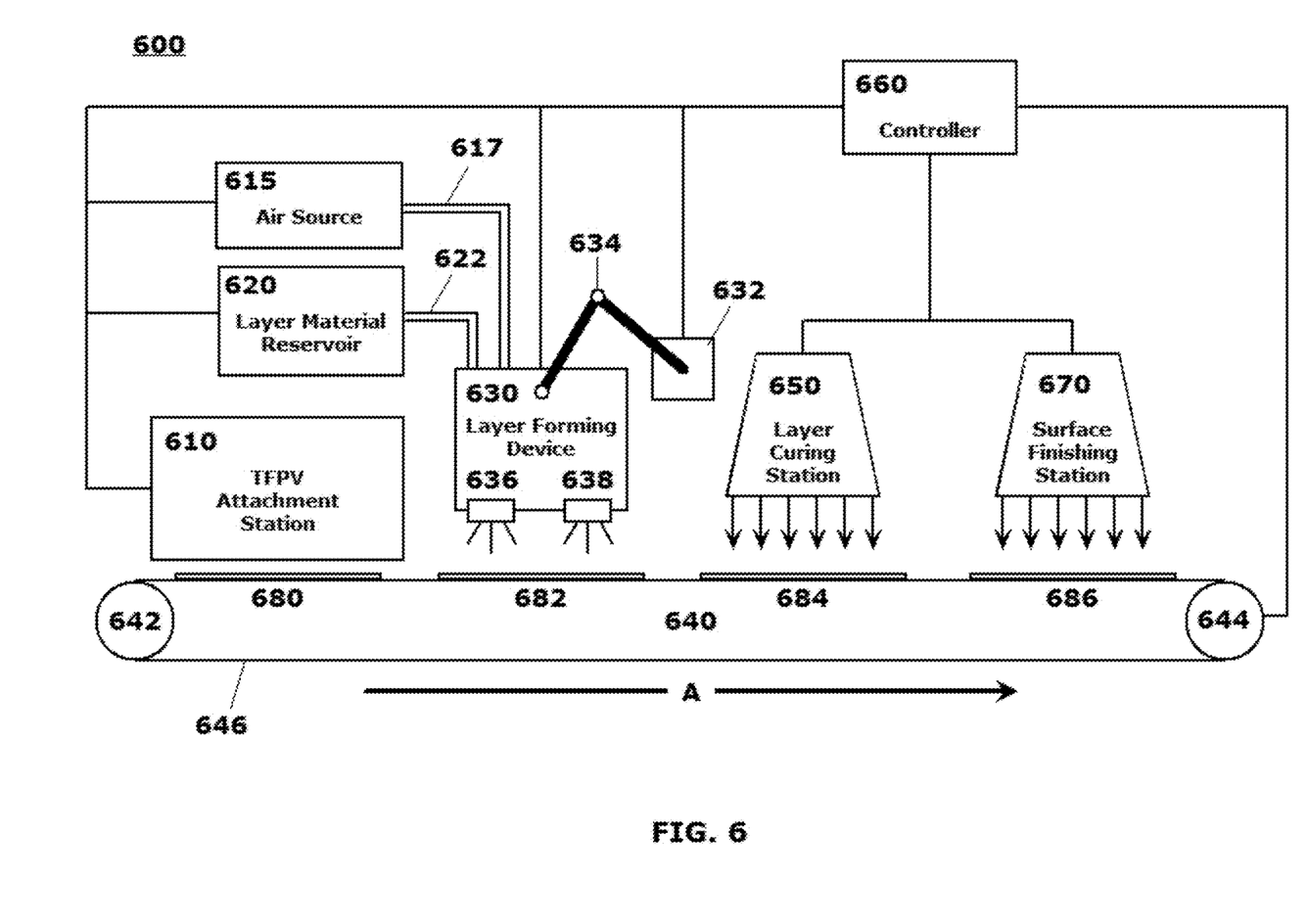
FIG. 6 illustrates a schematic diagram of an exemplary assembly line usable for automated forming of the exemplary laminated energy harvesting component on a substrate that constitutes a building structure component according to this disclosure.

FIG. 6 illustrates a schematic diagram of an exemplary assembly line usable for automated forming of the exemplary laminated energy harvesting component on a surface of a substrate that constitutes a building structure component according to this disclosure. The exemplary system 600 may be used to prepare and build the laminated energy harvesting component structure in a manner similar to that described above with reference to FIGS. 3A-3D.

As shown in FIG. 6, the exemplary system 600 may include an assembly line type transport component 640 which may be in a form of powered roller elements 642, 644 about which a movable platform in a form of, for example, a conveyor belt 646 may be provided to move a building structural component substrate past multiple processing station 680, 682, 684, 686 in a direction A to accomplish the layer forming and finishing elements of the laminated energy harvesting component build process. Operation of the transport component may be controlled by a controller 660.

A photovoltaic array or TFPV attachment station 610 may be provided along the assembly line, or separately, to provide for adhesive adherence of, for example, a TFPV material layer on a surface of the building structural component substrate when the building structural component substrate is positioned at processing station 680. The photovoltaic array or TFPV material layer may be electrically connected to one or more metal trace elements on a surface of, or on an edge of the building structural component substrate to implement electrical conductivity between adjacent substrates when installed on a building structure. Operation of the TFPV attachment station 610 may be controlled by the controller 660.

A layer forming device 630 may be provided at, for example, processing station 682 as the building structural component substrate moves in direction A from processing station 680. The layer forming device 630 may comprise a plurality of spray nozzles or spray heads 636, 638, which may be usable to facilitate deposition of a layer forming material over the previously placed TFPV material layer on a surface of the building structural component substrate.

The layer forming device 630 may be connected to an air source 615 via piping 617 and may separately be connected to a layer material reservoir 620 via piping 622. The layer forming device 630 may be usable to obtain a flow of layer material from the layer material reservoir 620 and entrain that layer material in an airstream provided by the air source 615 in a manner that causes aspirated layer material to be ejected from the spray nozzles or spray heads 636, 638 in a direction of the building structural component substrate when the building structural component substrate is positioned at processing station 682.

The layer material reservoir 620 may include separate chambers for a supply of substantially transparent micron-sized particles and for a supply of binder or matrix material. In embodiments, the particles and the matrix material may come premixed, the particles and matrix material may be mixed in the layer material reservoir 620, or the particles and matrix material may be separately fed to the layer forming device 630 and mixed therein before being entrained in the airstream provided to the layer forming device 630 by the air source 615. The layer forming device 630 may be a mounted structure or, in embodiments, the layer forming device 630 may be a movable structure mounted to the end of, for example, an articulated arm 634 that is mounted to a base component 632. In embodiments, a particle and matrix material mixture may be provided in a material supply reservoir of a conventional spray gun with an air source for delivery of the layer material in a delivery operation similar to a conventional spray painting of a surface. In embodiments, an entire surface of the building structural component substrate may be covered with the light scattering layer material. In this manner, a consistency of coloration in the building structural component substrate finish may be obtained as between areas including photovoltaic arrays and areas of the surface that do not include such underlying elements. Operation of the components of the layer forming device 630 (including the articulated arm 634 and the base component 632), the air source 615, and/or the layer material reservoir 620, may be separately controlled by the controller 660.

The building structural component substrate may be translated then to a processing position 684 opposite a layer curing station 650 that may employ known layer fixing methods including using heat, pressure, photo-initiated chemical reactions and the like to cure and/or finish the light scattering layers on the surface of the building structural component substrate. The building structural component substrate may then be translated to a processing station 686 opposite a surface finishing station 670 which may, for example, to deposit a clearcoat over an entire surface of the building structural component substrate, or undertake other finishing processing of the surface of the building structural component substrate.

The exemplary system 600 may operate under the control of a processor or controller 660. Layer and object forming information may be input regarding at least one light scattering layer to be formed and fixed on an object or substrate by the exemplary system 600. The controller 660 may be provided with object forming data that is devolved, or parsed, into component data to execute a controllable process in which one or more light scattering layers are formed to produce a single color, a multi-color, texturized surface or an image-patterned presentation when viewed from the viewing, observation or light incident side of a finished light scattering layer on the building structural component substrate.

Figure 7:
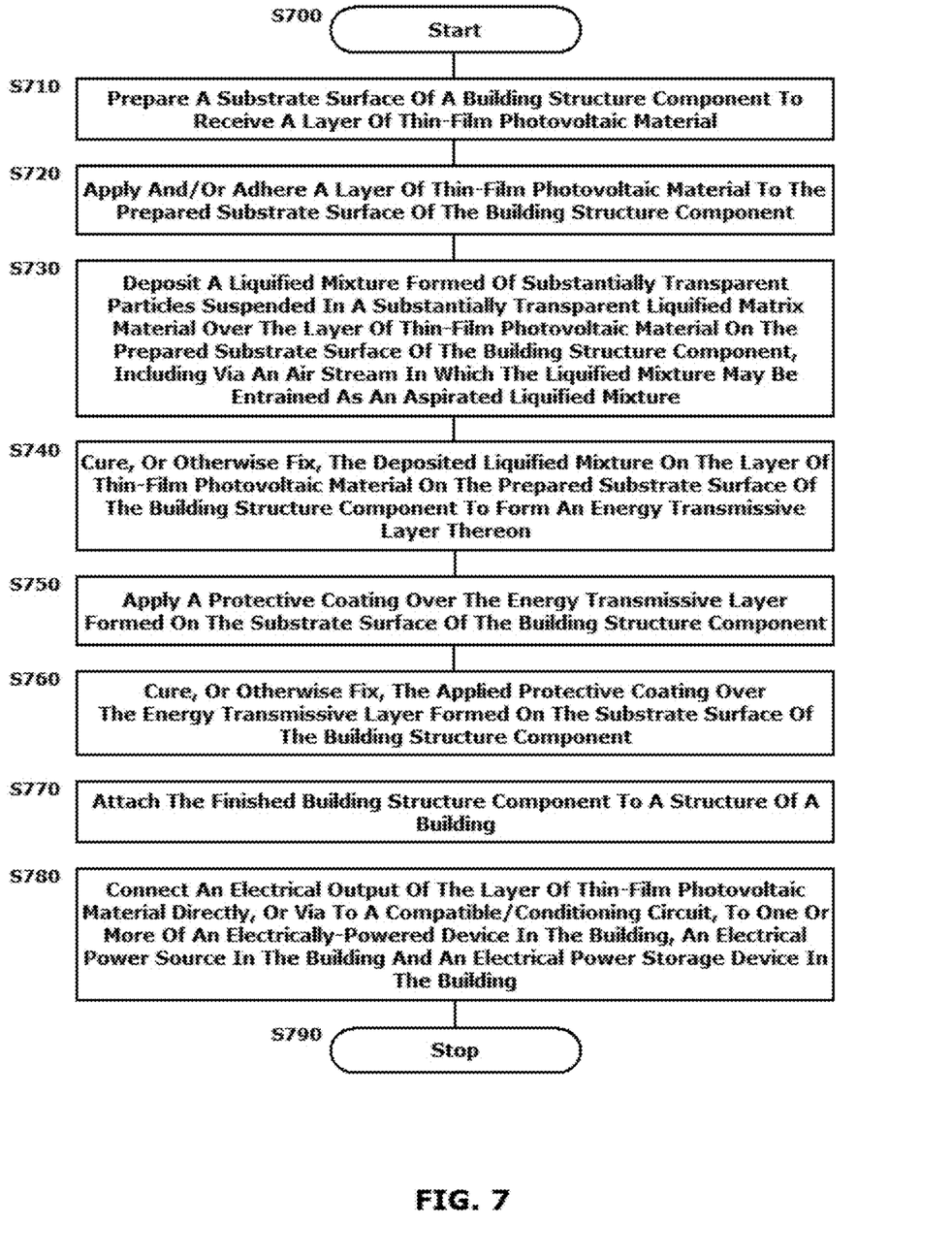
FIG. 7 illustrates a flowchart of an exemplary method for integrating a unique energy harvesting system, including an energy/light scattering layer, on a surface of a building structure component according to this disclosure.

The disclosed embodiments may include an exemplary method for integrating a unique energy harvesting system, including an energy/light scattering layer (energy transmissive layer), on a building structural component substrate. FIG. 7 illustrates a flowchart of such an exemplary method. As shown in FIG. 7, operation of the method commences at Step S700 and proceeds to Step S710.

In Step S710, one or more discrete substrate surfaces of a building structural component may be prepared to receive a layer of TFPV material. The building structural component substrate may be processed as a separate component, including any one or more of the building components listed above, which may be later attached to a building structure. Otherwise, the building structural component substrate may be a discrete portion or portions of the building structure, which may be processed on site. Operation of the method proceeds to Step S720.

In Step S720, a layer of TFPV material may be applied to the prepared substrate surface of the building structural component substrate according to an application method that may adhere the layer of TFPV material to the building structural component substrate. Compatible adhesive materials, including chemical, heat, or light activated adhesive materials, may be used to provide the adherence of the TFPV material layer to the building structural component substrate. It should be noted that portions of the particular building structural component substrate not covered by the TFPV material may be separately or coincidentally prepared with finishes that are comparable to the finish displayed by the TFPV material layer in order that the building structural component substrate may provide a consistent underlying appearance, particularly with regard to an optical reflectance, for application of the energy transmissive layer materials thereon. Operation of the method proceeds to Step S730.

In Step S730, a liquefied mixture of components for forming an energy transmissive layer composed of substantially transparent particles suspended in a substantially transparent liquefied matrix may be deposited over the layer of TFPV material, or over an entire body structure of the building structural component substrate. Such deposition may be according to any technique by which a liquefied matrix, which may appear in the form of the paint-like substance, may be applied to any substrate. In this regard, the liquefied mixture may be poured on, rolled on, brushed on, or sprayed on the surface of the building structural component substrate. In this latter case, an airstream may be provided from an air source in which the liquefied mixture may be entrained as one of an aspirated and aerosol liquefied mixture. Operation of the method proceeds to Step S740.

As indicated above, in embodiments, the liquefied mixture may include formed multi-layered substantially transparent particles suspended in a substantially transparent liquefied matrix material to form the liquefied mixture. The substantially transparent liquefied matrix material may be selected to have an index of refraction similar to the substantially clear outer layers or shells of the substantially transparent particles in order to substantially reduce any potential for refractive interference between adjacent particles when deposited on the surface of the building structural component substrate. The substantially transparent liquefied matrix material may include components to aid in adherence of the finished energy transmissive layers on the portions of the surface of the building structural component substrate on which those layers are ultimately formed. The substantially transparent liquefied matrix material may include components to aid in fixing of the substantially transparent particles in the layer, including heat-activated and/or light-activated hardeners. Comparatively large size transparent particles, on the order of tens of microns, may be used. The sizing of the particles to be less than 5 microns, however, expands the latitude by which the substantially transparent particles suspended in the matrix material may be delivered to the surface of the building structural component substrate by rendering those particles compatible with the spray techniques discussed above. As such, in a delivery process that mirrors conventional spray painting, the aspirated liquefied mixture may be deposited on the prepared surface to form the energy transmissive layer that passes certain wavelengths of energy/light through the layer and scatters other selectable wavelengths of energy/light to render a perceptibly single color, multi-color, patterned, texturized or image-wise presentation of scattered light from the light incident surface based on one or more delivery passes for depositing the energy transmissive layer materials according to the above-described schemes.

In Step S740, the deposited liquefied mixture may be developed, cured, or otherwise fixed over the TFPV material layer, and on any other portions of the building structural component substrate onto which the liquefied mixture is deposited for coloration of those portions of the building structural component substrate to form a fixed energy transmissive layer thereon. Operation of the method proceeds to Step S750.

In Step S750, a protective coating may be applied over the energy transmissive layer. The protective coating may take a form of, for example, a commercial clearcoat finishing composition. Operation of the method proceeds to Step S760.

In Step S760, the applied protective coating may be cured or otherwise fixed over the energy transmissive layer formed on the surface of the building structural component substrate. Operation of the method proceeds to Step S770.

In Step S770, in instances in which the building structural component substrate was a separate component of the overall building structure, the finished building structural component substrate may be assembled to the building. Operation of the method proceeds to Step S780.

In Step S780, wired (or wireless) connections may be made from an electrical output of the layer of TFPV material directly, or via a compatible and/or conditioning circuit that is configured to provide a connection of the energy harvesting component in the form of the layered structure including the TFPV material layer, to one or more of an electrically-powered component in the building, an electrical power source in the building and/or an electrical power storage device in the building. Operation of the method proceeds to Step S790, where operation of the method ceases.

The above-described exemplary particle and material formulations, layered component build processes, and systems and methods for applying laminated energy harvesting components to portions of a building structural component substrate reference certain conventional components, energy harvesting elements, materials, and real-world use cases to provide a brief, general description of suitable operating, product processing, energy/light scattering (transmissive) layer forming and building structural modification and integration environments in which the subject matter of this disclosure may be implemented for familiarity and ease of understanding. Although not required, embodiments of the disclosure may be provided, at least in part, in a form of hardware control circuits, firmware, or software computer-executable instructions to control or carry out the laminated structure development functions described above. These may include individual program modules executed by processors.

Those skilled in the optics, electrical generation and building construction arts will appreciate that other embodiments of the disclosed subject matter may be practiced in many disparate film forming, layer forming, laminate layer forming and building construction systems, techniques, processes and/or devices, including various machining, molding, additive and subtractive layer forming and manufacturing methods, of many different configurations.

Embodiments within the scope of this disclosure may include processor components that may implement certain of the steps described above via computer-readable media having stored computer-executable instructions or data structures recorded thereon that can be accessed, read and executed by one or more processors for controlling the disclosed energy/light scattering layer forming and building integration schemes. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures for carrying into effect, for example, computer-aided design (CAD) or computer-aided manufacturing (CAM) of particular objects, object structures, layers, and/or layer components.

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of method steps represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 7, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

We claim:

1. A method for integrating an energy harvesting system in a building, comprising:
    arranging an energy harvesting element on a surface of a building structural component; and
    arranging an energy transmissive layer arranged over the energy harvesting element on the surface of the building structural component, the energy transmissive layer having a body-facing side facing the surface of the building structural component, and an energy-incident side opposite the body-facing side,
    the energy transmissive layer passing 50% or more of light energy impinging on the energy transmissive layer through the energy transmissive layer to activate the energy harvesting element;
    the energy transmissive layer being formed of a material composition comprising a plurality of substantially-transparent particles and a substantially-transparent matrix material that fixes the plurality of substantially-transparent particles in a layer arrangement to form the energy transmissive layer;
    forming each of the plurality of substantially-transparent particles of a spherical core formed of a first transparent dielectric material, the spherical core having a value of a physical diameter equal to a half wavelength of a first selected color of light component to be reflected by the particle;
    a plurality of material layers disposed radially outwardly from the spherical core, each of the plurality of material layers being formed of at least a second transparent dielectric material,
    and having a value of a physical thickness equal to a quarter wavelength of at least a second selected color of light component to be reflected by the particle; and
    an outer coating comprised of another transparent dielectric material having a selected index of refraction of 2 or less.

2. The method of claim 1, further comprising fixing the plurality of substantially-transparent particles in the matrix material in a manner that causes the energy-incident side to reflect substantially all of one or more selectable wavelengths of the impinging light energy in all directions on the energy-incident side to present the consistent opaque appearance.

3. The method of claim 1, further comprising adjusting an index of refraction of the substantially transparent matrix material to be a same index of refraction as the outer coating.

4. The method of claim 1, the energy harvesting element comprising a photovoltaic element.

5. The method of claim 4, the photovoltaic element being a photovoltaic film (PVF) material.

6. The method of claim 5, further comprising applying the PVF material to one or more first discrete portions of the surface of the building structural component.

7. The method of claim 6, further comprising applying a layer of adhesive to the one or more first discrete portions of the surface of the building structural component before applying the PVF material to the one or more first discrete portions, the layer of adhesive affixing the PVF material to the surface of the building structural component in the one or more first discrete portions.

8. The method of claim 6, further comprising applying a surface treatment to at least second portions of the surface of the building structural component,
    the second portions of the surface of the building structural component being different portions than the first portions, and
    the surface treatment rendering an optical reflectance of the second portions substantially equal to an optical reflectance of the PVF material in the first portions.

9. The method of claim 1, the arranging the energy transmissive layer over the energy harvesting element on the surface of the building structural component comprising:
    delivering the material composition in a liquid form; and
    applying one of heat or light energy to fix the material composition to form the energy transmissive layer.

10. The method of claim 9, each of the substantially-transparent particles having a diameter in a range of 5 microns or less.

11. The method of claim 10, each of the substantially-transparent particles having a diameter in a range of 1.0 to 3.0 microns.

12. The method of claim 11, the delivering the material composition in a liquid form comprising:
    entraining the material composition in an air stream; and
    spraying the entrained material composition on the surface of the building structural component.

13. The method of claim 12, further comprising separately entraining the plurality of substantially-transparent particles and the substantially-transparent matrix material in the air stream to form the material composition sprayed on the surface of the building structural component.

14. The method of claim 1, further comprising establishing an electrical connection from the energy harvesting element to at least one of an electrical energy power source, an electrical energy storage device and an electrically powered component device in the building for transmitting electrical energy generated by the electrical harvesting element.

15. The method of claim 14, the electrical connection comprising at least one of an electrical energy converting circuit or an electrical energy conditioning circuit.

16. The method of claim 1, further comprising arranging a substantially transparent protective coating over the energy transmissive layer.

17. The method of claim 1, the energy transmissive layer being arranged to pass 80% or more of light energy impinging on the energy transmissive layer through the energy transmissive layer to activate the energy harvesting element.

18. The method of claim 1, the energy harvesting element being arranged on a surface of the building structural component by being at least partially accommodated in a cavity in the surface of the building structural component.

\* \* \* \* \*